United States Patent
Voshell (10) Patent No.: US 7,346,818 B2
(45) Date of Patent: *Mar. 18, 2008

(54) METHOD AND APPARATUS FOR REDUNDANT LOCATION ADDRESSING USING DATA COMPRESSION

(75) Inventor: Thomas W. Voshell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 493 days.

This patent is subject to a terminal disclaimer.

(21) Appl. No.: 11/007,502

(22) Filed: Dec. 7, 2004

(65) Prior Publication Data

US 2005/0099875 A1    May 12, 2005

Related U.S. Application Data

(63) Continuation of application No. 09/695,756, filed on Oct. 24, 2000, now Pat. No. 6,842,874, which is a continuation of application No. 09/012,036, filed on Jan. 22, 1998, now Pat. No. 6,138,254.

(51) Int. Cl.
G11C 29/00    (2006.01)

(52) U.S. Cl. ............................ 714/723; 714/7; 714/8; 714/710; 710/68

(58) Field of Classification Search ............... 714/718, 714/737, 710, 711, 68, 40, 41, 42, 8, 6; 257/203, 257/208; 341/50–51
See application file for complete search history.

(56) References Cited

U.S. PATENT DOCUMENTS

| | | | |
|---|---|---|---|
| 4,290,105 A | 9/1981 | Cichelli et al. ............. | 362/200 |
| 4,558,302 A | 12/1985 | Welch ......................... | 340/347 |
| 4,628,509 A | 12/1986 | Kawaguchi ................... | 371/21 |
| 4,642,793 A | 2/1987 | Meaden ....................... | 364/900 |
| 4,979,039 A | 12/1990 | Kisor et al. ................. | 358/133 |
| 5,276,834 A | 1/1994 | Mauritz et al. ............. | 395/425 |
| 5,317,573 A | 5/1994 | Bula et al. .................. | 371/10.3 |

(Continued)

OTHER PUBLICATIONS

NA8908427 'Method of Identifying Non-Repairable Fail Patterns', IBM Technical Disclosure Bulletin, Aug. 1989, US , vol. 32 No. 3A; Aug. 1, 1989, pp. 1-2.*

Hancu, Marius V.A. et al, "A Concurrent Test Architecture for Massively Parallel Computers and Its Error Detection Capability", IEEE Transactions on Parallel and Distributed Systems, vol. 5, No. 11, Nov. 1994. pp. 1169-1184.

(Continued)

Primary Examiner—Guy J. Lamarre
(74) Attorney, Agent, or Firm—Dorsey & Whitney LLP (57) ABSTRACT

A method and apparatus for identifying defective cells in a memory array includes receiving a request for accessing an address and analyzing the address to determine when the address matches an address stored in a temporary memory array. When the address does not match any address stored in the temporary memory array, a wait instruction is sent to a processor and the address is analyzed to determine which portion of compressed data stored in a map memory array to decompress. The map memory array stores data containing compressed addresses of defective cells in a first memory array. The portion of compressed data is then decompressed to provide expanded data when the address does not match any address stored in the temporary memory array. The expanded data are then written to the temporary memory array, and the expanded data are compared to the address to determine when the address corresponds to an expanded datum of the expanded data.

21 Claims, 5 Drawing Sheets

U.S. PATENT DOCUMENTS

| | | | | |
|---|---|---|---|---|
| 5,363,382 A | 11/1994 | Tsukakoshi | ............... | 371/21.2 |
| 5,373,290 A | 12/1994 | Lempel et al. | ............... | 341/51 |
| 5,410,671 A | 4/1995 | Elgamal et al. | ............ | 395/425 |
| 5,632,024 A | 5/1997 | Yajima et al. | ............. | 395/381 |
| 5,659,737 A | 8/1997 | Matsuda | .................... | 395/612 |
| 5,781,486 A | 7/1998 | Merritt | ....................... | 365/201 |
| 5,854,796 A | 12/1998 | Sato | ......................... | 371/21.1 |
| 5,881,221 A | 3/1999 | Hoang et al. | ......... | 395/183.18 |
| 5,910,921 A | 6/1999 | Beffa et al. | ................ | 365/201 |
| 5,996,096 A | 11/1999 | Dell et al. | ................. | 714/710 |
| 6,035,432 A | 3/2000 | Jeddeloh | .................... | 714/763 |
| 6,134,681 A | 10/2000 | Akamatsu et al. | ......... | 714/710 |
| 6,138,254 A * | 10/2000 | Voshell | ...................... | 714/710 |
| 6,374,250 B2 | 4/2002 | Ajtai et al. | ................ | 707/101 |
| 6,842,874 B1 * | 1/2005 | Voshell | ...................... | 714/723 |

OTHER PUBLICATIONS

IBM Technical Disclosure Bulletin, "Improved Hash and Index Searching Techniques for Computers Using a Cache and/or Virtual Memory", vol. 31, No. 1, Jun. 1, 1998. 2 pages.

Park, Arvin et al., "Address Compression Through Base Register Caching", Division of Computer Science, IEEE, Nov. 1990. pp. 193-199.

Sakai, Yuji et al, "A Wafer Scale Fail Bit Analysis System for VLSI Memory Yield Improvement", IEEE Int. Conference on Microelectronic Test Structures, vol. 3, Mar. 1990. pp. 175-177.

* cited by examiner

METHOD AND APPARATUS FOR REDUNDANT LOCATION ADDRESSING USING DATA COMPRESSION

CROSS-REFERENCE TO RELATED APPLICATIONS

This application is a continuation of U.S. patent application Ser. No. 09/695,756, filed Oct. 24, 2000 now U.S. Pat. No. 6,842,874, which is a continuation of U.S. patent application Ser. No. 09/012,036, filed Jan. 22, 1998, issued Oct. 24, 2000 as U.S. Pat. No. 6,138,254.

TECHNICAL FIELD

This invention generally concerns memory arrays, and more particularly, techniques for identifying and substituting for defective locations in memory arrays.

BACKGROUND OF THE INVENTION

Memory arrays consist of a number of storage locations or memory cells. Memory arrays are generally coupled to a storage control unit for accessing storage locations (cells) in order to store information in, or to retrieve information from, the memory array. Memory arrays are generally constructed in a reliable and robust manner. However, some random number of memory locations may be or become defective. It is desirable to avoid storing data to, or retrieving data from, defective memory locations. In order to avoid accessing defective memory locations, a memory map is generally devised to map addresses for defective memory array cells to another memory array or another portion of the memory array that is known to be operative. This memory array or portion is commonly referred to as a spare or a redundant memory array. The memory map is stored in another memory array, known as the map memory array. The size required for the spare and map memory arrays depends on the number of defective memory cells to be replaced. If the primary or first memory array requires that all locations be spared, the spare memory array will need to be as large as the first memory array and the map memory array will also need to be large. Since relatively few locations in the first memory array usually are defective, the size of the spare memory array is usually far less than the size of the primary or first memory array. It is desirable, of course, to make the spare and map memory arrays as small as possible, as unused locations dedicated to spare or map memory are wasted and this wastes resources. In order to maximize the efficient use of memory resources, there is need for a method and corresponding apparatus for reducing the amount of data to be stored in the map memory array.

SUMMARY OF THE INVENTION

One aspect of the invention provides a memory system having first, second, and third memories, and a control circuit. The first and third memories have addressable memory locations configured to store data. The second memory has memory locations configured to store hash codes and decompressed addresses for addressable memory locations of the first memory. The control circuit is configured to generate a first hash code from a requested address to a memory location in the first memory and compare the first hash code to hash codes for decompressed addresses stored in the second memory. The control circuit determines whether an address stored in the second memory corresponds to the requested address in response to the first hash code matching a hash code for a decompressed address and accesses a memory location in the third memory in response to an address stored in the second memory corresponding to the requested address.

Another aspect of the invention provides a memory system having first, second, and third memories, and a control unit. The first and third memories have addressable memory locations, and the second memory is configured to store memory addresses corresponding to defective addressable memory locations in the first memory. The memory addresses stored in the second memory are in a compressed format having substitute addresses associated and stored with therewith. The control unit is configured to decompress compressed memory addresses stored in the second memory and compare a memory address for an addressable memory location in the first memory to the decompressed memory addresses. In response to the memory address for the addressable memory location matching one of the decompressed memory addresses, the control unit extracts the substitute address associated with the matching decompressed memory address and accesses an addressable memory location in the third memory corresponding to the extracted substitute address rather than the addressable memory location in the first memory corresponding to the memory address.

DETAILED DESCRIPTION OF THE INVENTION

Figure 1:
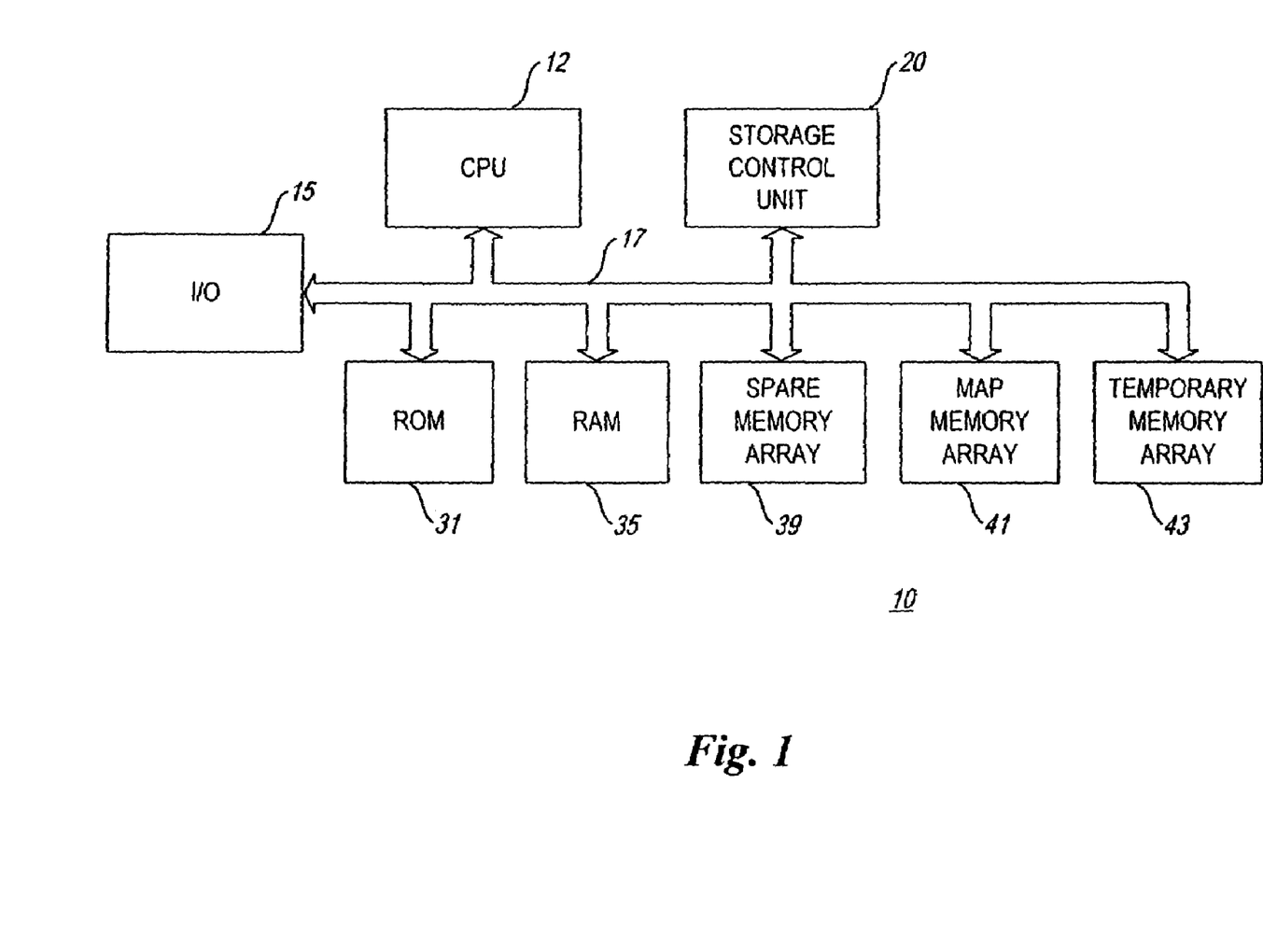
FIG. 1 is a block diagram of a computer system employing a compression engine in accordance with an embodiment of the present invention.

FIG. 1 is a block diagram of a computer system 10 that uses one embodiment of the present invention. The computer system 10 includes a central processing unit or CPU 12 coupled by a bus 17 to an input/output or I/O device 15 and to a storage control unit 20. In a preferred embodiment, the CPU 12 may be a 68040 processor available from Motorola of Phoenix, Ariz. or a Pentium® processor available from Intel of Santa Clara, Calif. I/O device 15 may comprise a keyboard, one or more disk data storage units, a display, a printer or coupling to external data sources such as a local area network or the like.

The storage control unit 20 couples via the bus 17 to a collection of memory devices including ROM 31, RAM 35 (i.e., the primary memory or first memory array), a spare memory array 39, a map memory array 41 and a temporary memory array 43. The spare memory array 39, map memory array 41 and/or temporary memory array 43 may be included within the storage control unit 20, may comprise sections of RAM 35 reserved for this purpose or may comprise separate memory units.

The storage control unit 20 is coupled via bus 17 to the map memory array 41 and the temporary memory array 43. In operation, the CPU 12 operates on data from the I/O device 15 in response to commands retrieved from memory, either from ROM 31 or RAM 35 via the storage control unit 20, and also stores data via the storage control unit 20 into RAM 35. Memory cells in each of the memories ROM 31, RAM 35, spare memory array 39, map memory array 41 and temporary memory array 43 include a regular arrangement having a fixed number of dimensions. These dimensions are ordered in some fashion, e.g., page, row and column. Each of these dimensions are then subdivided and numbered, for example, page 1, 2, 3 and the like. This common scheme specifies a regular structure, repeating for some interval. This also allows for easy accessing of data stored in the memory array as the page number, row number and column number are all that is necessary to access memory cells for information storage or retrieval. Because of the regular structure of the memory array, creating a map to direct retrieval or storage to spare memory cell locations in the spare memory array 39 for replacement of defective memory cells in, e.g., RAM 35, is also simplified.

For example, if page 3, row 16, column 32 is the location of a defective storage cell, the map may need only the numbers 3, 16, 32 in order to provide a replacement memory cell. Replacement locations are normally assigned on a first come, first served basis. Thus, for every entry in the map memory array 41, a sequential replacement location may be assigned in the spare memory array 39. While this method allows efficient and easy access to replacement memory cells in the spare memory array 39, certain types of defects consume large amounts of the map memory array 41 storage space.

In the case where errors are not in a random distribution, e.g., burst errors where multiple cells are centered around a particular location, or the loss of an entire dimension in the memory array, such as the loss of an entire row or column, significant efficiencies may be gained in utilization of the map memory array 41 using data compression to reduce the map data size required to store the addresses of the defective memory cells in the map memory array 41 prior to storage. For example, if page 0, row 10, column 13 in RAM memory array 35 had 192 consecutive defective locations on it, starting with the first location, then a simple data compression saving 191 map locations is effected by representing the defects in the RAM memory array 35 with the record 0, 10, 13, 192. This is a relatively primitive approach to data compression, however, it illustrates the basic principle. When more sophisticated compression algorithms are used, greater compression efficiency may be achieved.

In the operation of the computer system 10 of FIG. 1, the storage control unit 20 scrutinizes all memory access requests. When a particular memory access request matches an address encoded in the compressed data stored in the map memory array 41, e.g., as discussed with respect to FIGS. 3 through 5, an address in the spare memory array 39 is substituted for the requested address. This substituted address selects a memory cell from the spare memory array 39 instead of, for example, from RAM 35. This process requires some portion of the data in the map memory array 41 to be decoded from the compressed state (as stored in the map memory array 41), in order to utilize defective cell address data from the map memory array 41.

One way of accomplishing this is to use a hash coding algorithm. During data compression within storage control unit 20, a code word may be generated that points to each defective cell address from the RAM 35 mapped in the map memory array 41. A cyclic code or some other robust process may be used to quickly produce a unique code word for each defective cell address in the primary memory. This code word represents a "hash code" and may be used as an index into the decompressed addresses and their associated hash codes stored in temporary memory array 43.

One way to generate hash codes is to treat the address data as a contiguous series of bits, i.e., as a number. This number is then divided by a prime number, such as 11. The most significant bits of the hash code provide an estimate of the address data and is useful as a quick index to a given number of replacement records in the map memory array 41.

When a hash code matching one of the hash codes stored in the temporary memory array 43 is produced by analysis of the address for the accessed memory cell site, the matching record in the temporary memory array 43 is used to redirect access to the spare memory array 39. When the comparison of the hash code for the address to which access is sought to the hash codes stored in the temporary memory array 43 produces a "miss" i.e., the defective cell addresses in the primary memory array 35 are not available in expanded form in the temporary memory array 43, a wait request may be issued to the CPU 12 while the data stored in the map memory array 41 are decompressed by the storage control unit 20.

Alternatively, an estimate may be made as to the range of memory array addresses required and some of the compressed data from the map memory array 41 may be uncompressed by the storage control unit 20 and then stored in the temporary memory array 43. A least-recently-used algorithm may be used to specify replacement cell addresses from the temporary memory array 43.

Figure 2:
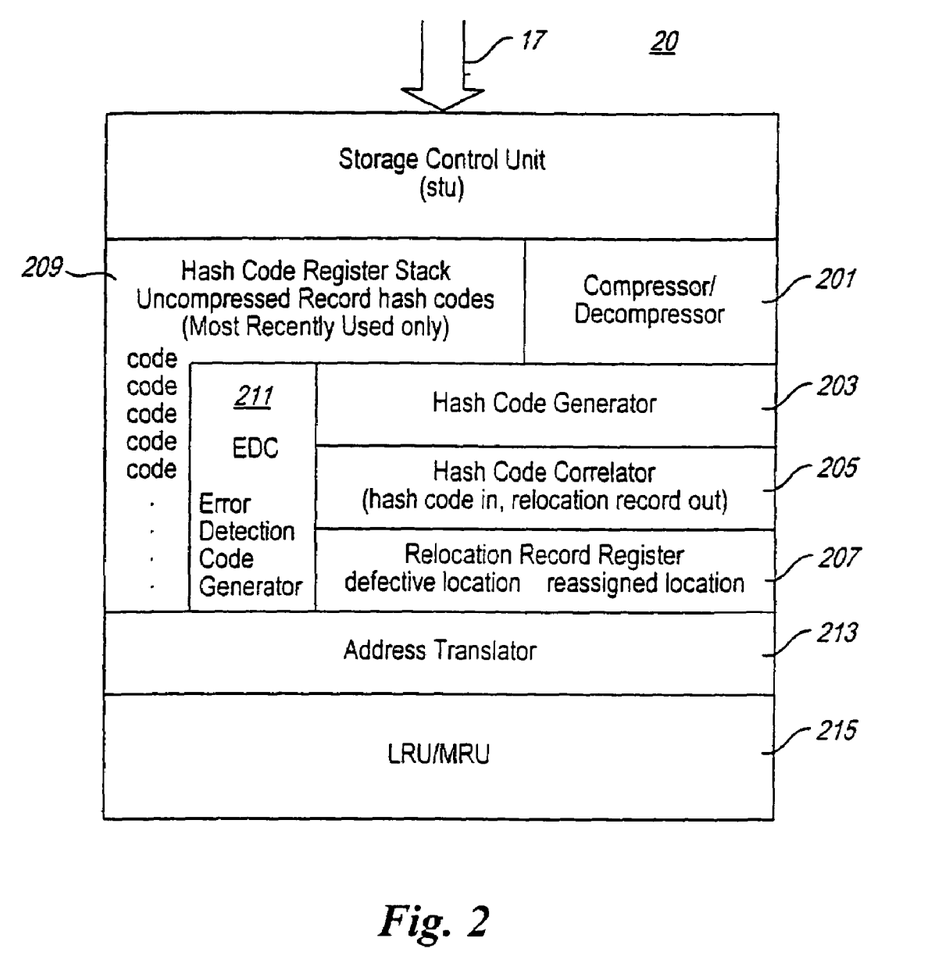
FIG. 2 is a block diagram of the memory storage control unit in a preferred embodiment of the invention.

In a preferred embodiment, the storage control unit 20 of FIG. 1 is realized as illustrated by the block diagram of FIG. 2. A first component 201 acts as a compression engine, to provide compressed data to, and to decompress compressed data from, the map memory array 41. The first component 201 also acts to set a compression flag for the hash code in the hash code storage area of the map memory array 41. A hash code generator 203 generates hash codes from addresses using any known method for providing truncated codes as indices. A hash code correlator 205 takes error location and hash code data and uses the hash code to quickly approximate addresses corresponding to bad cell address data stored in the map memory array 41. A relocation record register 207 stores one relocation record to provide access to relocated data, i.e., data corresponding to the address currently being accessed in spare memory array 39.

A hash code register stack 209 stores hash codes for uncompressed address data from the map memory array 41 that are stored in the temporary memory array 43. The hash code register stack 209 provides quick reference to the storage addresses corresponding to defective memory locations in RAM 35 that have been most recently accessed and includes records for hash codes corresponding to memory locations that are currently stored in an uncompressed state, for example, in temporary memory array 43. An error detection code generator 211 provides and stores a check code every time a memory location is accessed for a write operation. When the same memory location is read, another check code is generated and is compared with the earlier check code generated during the write operation. When the two code words differ, an error has occurred. The error check operation may be implemented using any known method, including methods as simple as parity checking or as thorough as the Reed-Solomon technique.

The storage control unit 20 then analyzes the address to determine if it is the address of a location known to have failed, using a hash code that is calculated when a memory cell test indicates a defective memory cell. When there is a match between the hash code for the current address to which access is sought and a stored hash code in the storage control unit 20, the storage control unit 20 fetches the relocation record from the relocation record register 207 using the using the address as a key, obtains the address in the spare memory array assigned to the requested address and substitutes this spare memory array address for the requested address. When there is no match between the hash code for the current address to which access is sought and a stored hash code in the storage control unit, the current address is treated as an address for a defective memory cell as described with reference to the initial memory testing (see FIGS. 3-5 and associated text). In either case, an address translator 213 passes the correct address in the spare memory array 39 to the bus 17. A least-recently-used/most-recently used register 215 maintains counts to accesses to hashed locations, i.e., to accesses to addresses within the spare memory array 39.

While FIG. 2 shows the computer system 10 as implementing the storage control unit 20 as a stand-alone unit, it will be appreciated that storage control unit 20 or one or more of the associated functions may be implemented in a number of other ways. For example, one or more of the functions of the storage control unit 20 may be included in software or in instructions contained in the ROM 31 and executed by the processor 12. Alternatively, one or more of the functions of the storage control unit 20, the spare memory array 39, the map memory 41 and the temporary memory array 43 may be implemented in the integrated circuit(s) comprising RAM 35.

Figure 3:
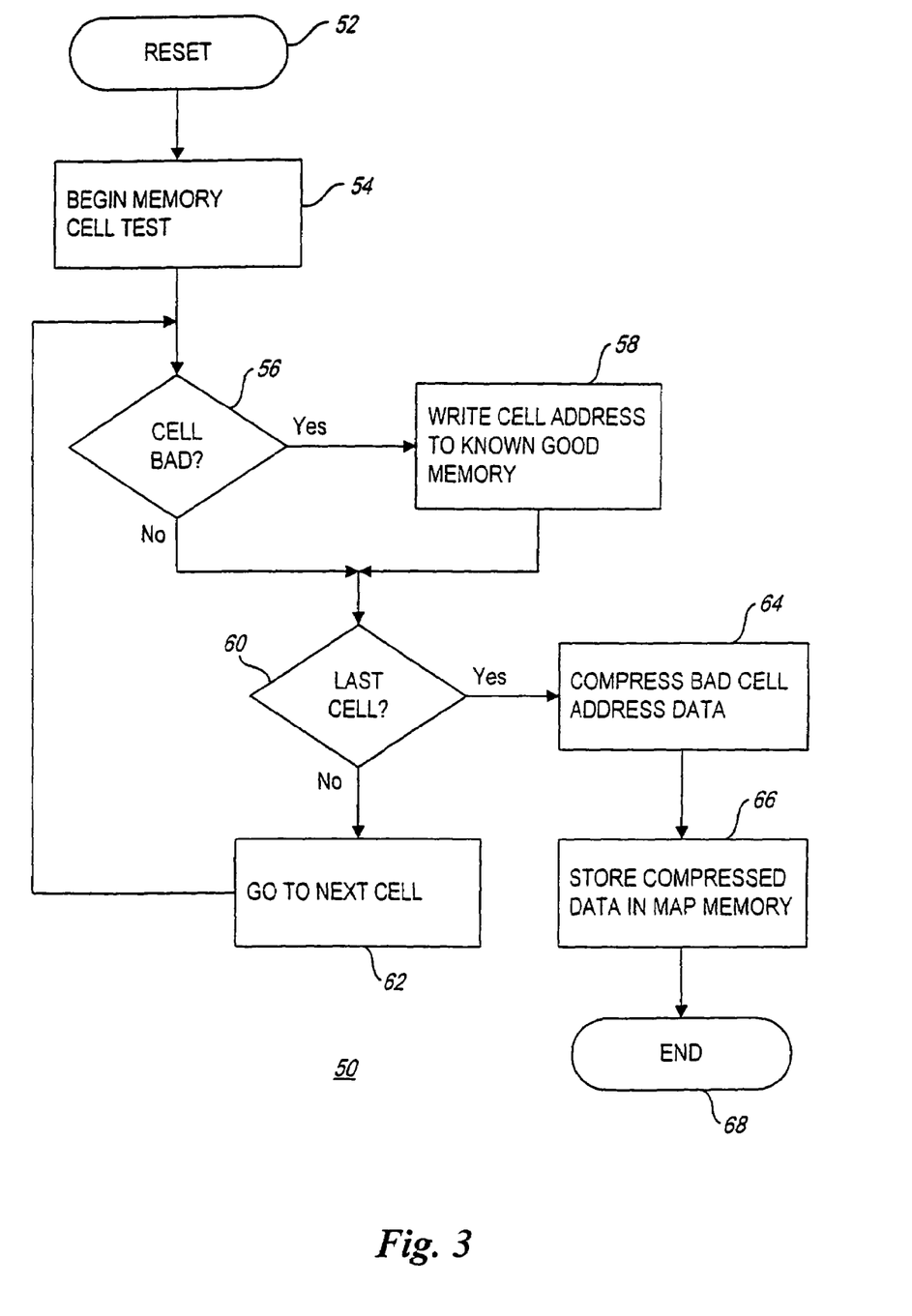
FIG. 3 is a flowchart of a process for testing a memory array in accordance with another embodiment of the invention.

FIG. 3 is a flow chart of a process 50 for testing a memory array to generate addresses of defective memory array cells in, for example, RAM 35, for compressing data describing defective memory array cell locations and for storing the compressed data describing defective memory array cell locations in the map memory array 41. Generally, the process 50 may be invoked on any sort of power on, reset or boot operation in step 52, or in response to other criteria such as a memory test command. Memory array cell testing begins in step 54 and then a query task 56 is invoked to determine if a given cell is defective. When the given cell is not defective, control passes to a query task 60 to determine whether or not that cell is the last cell to be tested. When the cell tested in the query task 56 is defective, the cell address is written to a temporary memory that is known to operate properly in step 58. Control then passes to the query task 60 again. When this is not the last cell to be tested, the process 50 advances to the next cell in step 62 and reinitiates the query task 56.

When the query task 60 determines that the last cell in the array has been tested, defective memory array cell address data are compressed in step 64, for example, via the storage control unit 20 of FIG. 1. The compressed data are stored in the map memory array 41 in step 66. The process 50 then ends in step 68.

The process 50 thus tests, for example, all memory locations in RAM 35 during a power on or reset operation, or any other type of reset operation (or in response to a memory test command). The process 50 gleans information describing defective memory array cell address data for RAM 35, compresses those data and then stores the compressed data in the map memory array 41.

Figure 4:
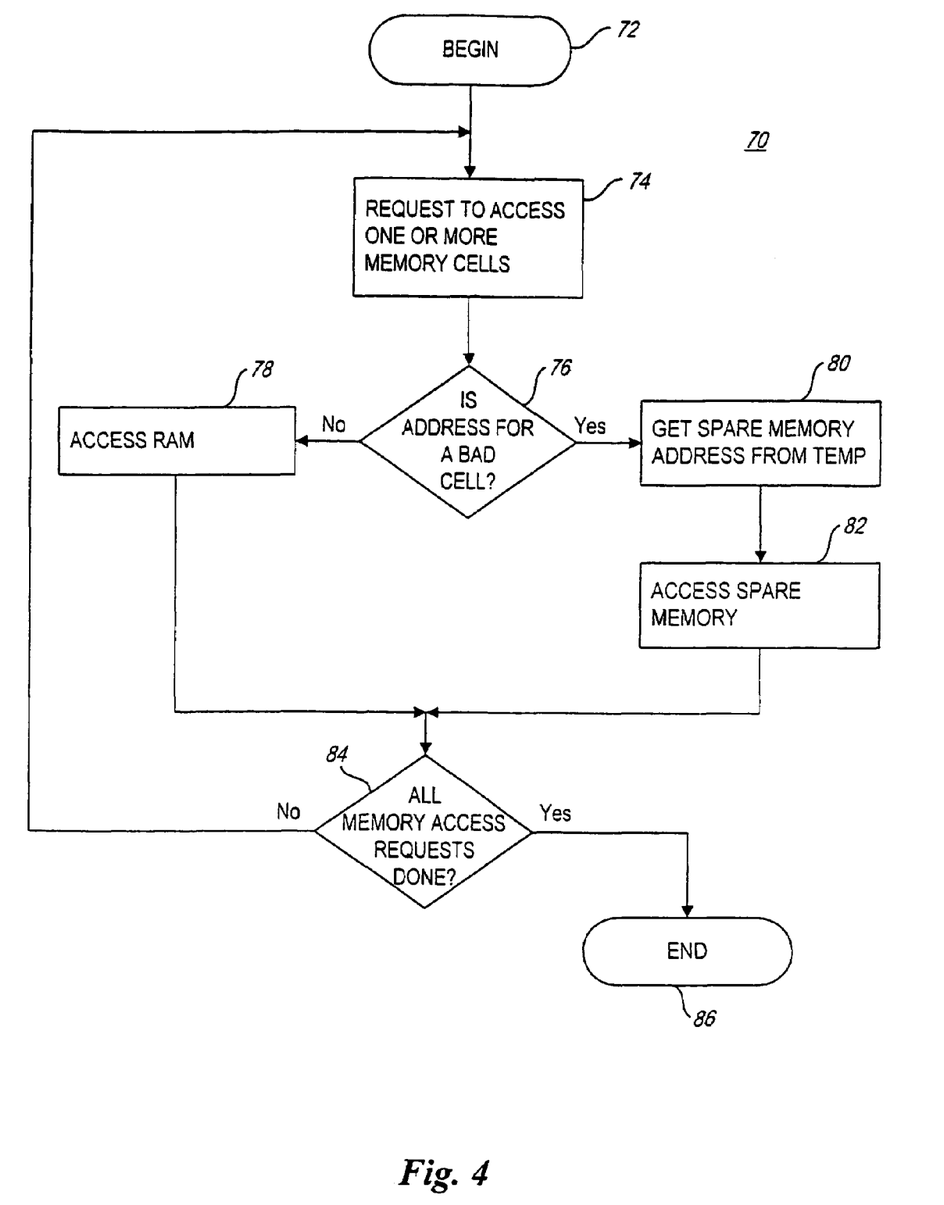
FIG. 4 is a flowchart of a process for accessing primary and spare memory array cells in accordance with yet another embodiment the invention.

FIG. 4 is a flow chart of a process 70 for processing memory array address requests. The process 70 begins in step 72 with a request to access one or more memory array cells in step 74. In a query task 76, the storage control unit 20 determines if the address to which access has been requested is for a defective memory array cell. This is discussed in more detail below with reference to FIG. 5. When the query task 76 determines that the address does not correspond to a defective memory array cell in, for example, RAM 35, RAM 35 is accessed in step 78. Control then passes to a query task 84 to determine whether or not all memory array access requests have been executed. When all memory array access requests have been executed, the process 70 ends in step 86. When not all memory array access requests have been processed, control passes to request access to one or more memory array cells in step 74.

When the query task 76 determines that a requested address is for a defective memory array cell, a spare memory array address is obtained from the temporary memory array 43 in step 80, and a cell in the spare memory array 39 is accessed in step 82. Control then passes to the query task 84 to determine whether or not all memory array access requests have been executed.

Figure 5:
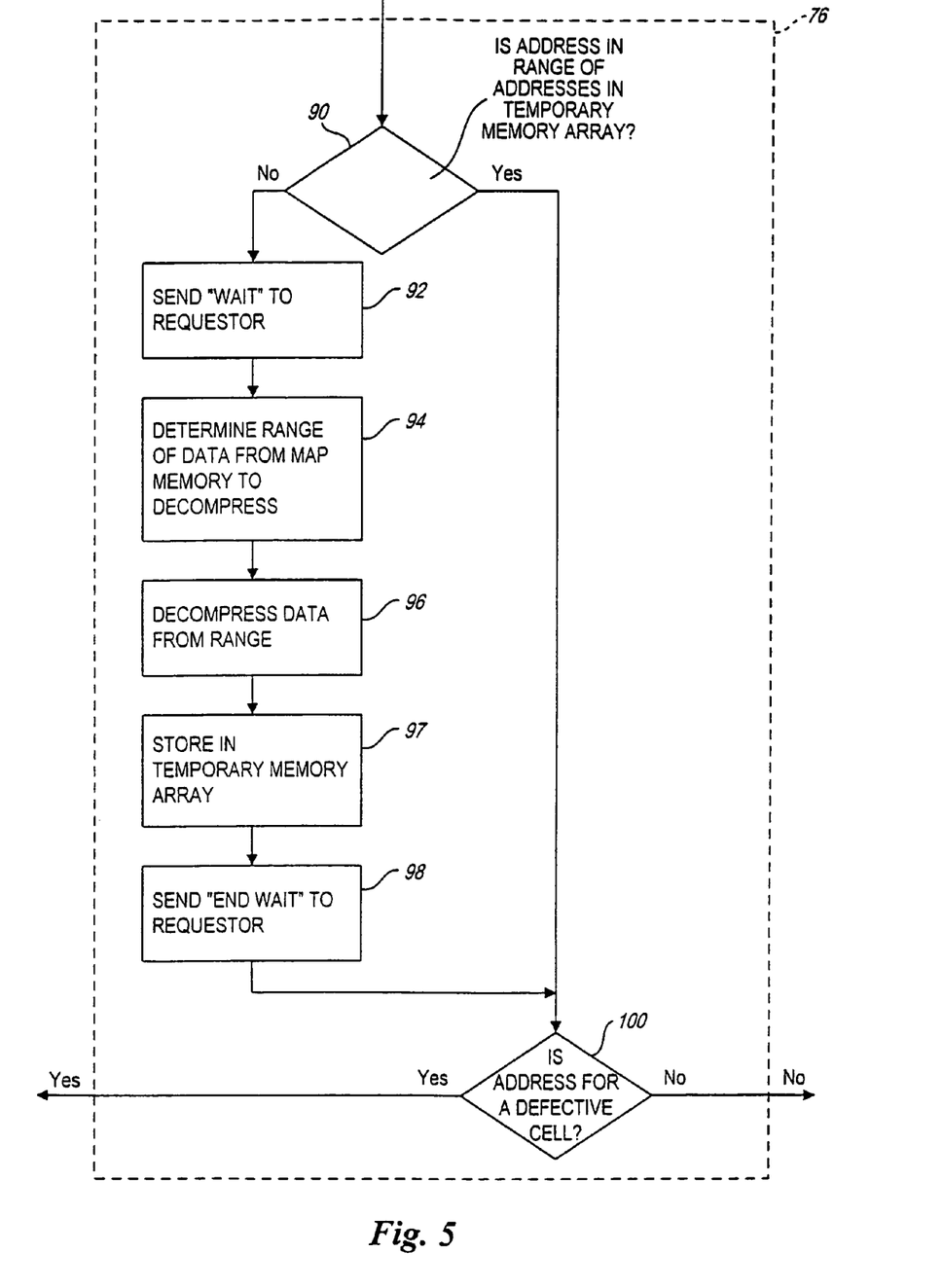
FIG. 5 is a flowchart of a portion of the process of FIG. 4, here the portion determines when a given memory cell location is defective.

FIG. 5 is a flow chart showing the query task 76 in more detail. The query task 76 begins with a query task 90 to determine if the address is in a range of addresses stored in the temporary memory array 43. When the requested address is in the range of addresses stored in the temporary memory array 43, control passes to a query task 100 to determine if the requested address corresponds to a defective memory array cell. The "yes" and "no" options of the query task 100 correspond to the "yes" and "no" options shown with query task 76 of FIG. 4.

When the address that is requested is not in the range of the temporary addresses stored in the temporary memory array 43, an optional "wait" signal may be passed in step 92 to the unit requesting memory access, such as the CPU 12 of FIG. 1. In one embodiment, a range of data to be decompressed from the map memory array 41 are estimated in step 94, and data falling within this range are decompressed in step 96 via the storage control unit 20 of FIG. 1. The decompressed address data are stored in step 97 in the temporary memory array 43 of FIG. 1. An optional "end wait" signal may then be sent in step 98 to the unit requesting memory access, for example, the CPU 12. Control then passes back to the query task 100 to determine if the requested address corresponds to one of the decompressed addresses for defective memory cells stored in the temporary memory array 43.

The invention as described may allow a memory array to be operated more efficiently by reducing the number of memory cells needed in order to store a map of defective memory cells in the memory array. It may be integrated into a memory chip, implemented in software or by discrete components or it may be employed together with memory devices in a larger system.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:
1. A memory system, comprising:
    a first memory having addressable memory locations configured to store data;
    a second memory having memory locations configured to store hash codes and decompressed addresses for addressable memory locations of the first memory a third memory having addressable memory locations configured to store data; and a control circuit coupled to the first, second and third memories, the control circuit configured to generate a first hash code from a requested address to a memory location in the first memory and compare the first hash code to hash codes for decompressed addresses stored in the second memory, the control circuit further configured to determine whether an address stored in the second memory corresponds to the requested address in response to the first hash code matching a hash code for a decompressed address and access a memory location in the third memory in response to an address stored in the second memory corresponding to the requested address.

2. The memory system of claim 1 wherein the control circuit is configured to generate the first hash code by dividing the value represented by the requested address by a prime number.

3. The memory system of claim 1 wherein the first memory and the second memory are separate memory devices.

4. The memory system of claim 1 wherein the control circuit is configured to determine if an address stored in the second memory corresponds to the requested address by comparing the requested address with decompressed addresses having the same hash code until a match occurs.

5. The memory system of claim 1, further comprising a fourth memory coupled to the control circuit, the fourth memory configured to stored compressed addresses and wherein the control circuit is further configured to decompress compressed addresses stored in the fourth memory and store the decompressed addresses in the second memory.

6. A memory system, comprising:
a first memory having addressable memory locations;
a second memory configured to store memory addresses corresponding to defective addressable memory locations in the first memory, the memory addresses stored in a compressed format having substitute address associated and stored with therewith;
a third memory having addressable memory locations; and
a control unit coupled to the first, second, and third memories, the control unit configured to decompress compressed memory addresses stored in the second memory and compare a memory address for an addressable memory location in the first memory to the decompressed memory addresses, the control unit further configured, in response to the memory address for the addressable memory location matching one of the decompressed memory addresses, to extract the substitute address associated with the matching decompressed memory address and access an addressable memory location in the third memory corresponding to the extracted substitute address rather than the addressable memory location in the first memory corresponding to the memory address.

7. The memory system of claim 6 wherein the control unit is configured to compare the memory address for the addressable memory location in the first memory by decompressing a portion of at least one of the compressed memory addresses stored in the second memory, calculating a value from the memory address for the addressable memory location in the first memory, and comparing the calculated value to the decompressed portion.

8. The memory system of claim 7 wherein the control unit is further configured to decompressing a portion of another one of the compressed memory addresses stored in the second memory responsive to the calculated value not matching the current decompressed portion and comparing the calculated value to the most recently decompressed portion.

9. The memory system of claim 7 wherein the control unit is configured to calculate a value from the memory address for the addressable memory location in the first memory by dividing the value represented by the memory address by a prime number.

10. The memory system of claim 6, further comprising a fourth memory coupled to the control unit and wherein the control unit is further configured to store the decompressed memory addresses in the fourth memory.

11. A memory control circuit comprising:
a control circuit configured to access memory arrays to retrieve data from a first memory array unit in response to memory access requests;
a first memory array coupled to the control circuit and having memory cells configured to store data;
a second memory array coupled to the control circuit and having memory cells to which defective memory cells of the first memory array are mapped; and
a data compression circuit coupled to the control circuit and configured to compress data representing memory addresses corresponding to defective memory cells of the first memory array to provide compressed addresses and further configured to decompresses compressed addresses to provide decompressed addresses.

12. The memory control circuit of claim 11, further comprising a third memory array coupled to the data compression circuit and configured to store the compressed addresses.

13. The memory control circuit of claim 12, further comprising a fourth memory array coupled to the control circuit and configured to temporarily store the decompressed addresses from the data compression circuit.

14. The memory control circuit of claim 13 wherein the first, second, third and fourth memory arrays comprise random-access memories.

15. The memory control circuit of claim 13 wherein the data compression circuit is configured to identify a starting and an ending address for a group of adjacent defective memory cells in the first memory array, generate compressed addresses from the starting address and a difference between the starting address and the ending address, and supply the compressed addresses to the third memory array.

16. The memory control circuit of claim 15 wherein the data compression circuit is configured to accept addresses of a group of adjacent addresses describing defective cell sites in the first memory array as a starting address and a difference between the starting address and the ending address and reconstructs individual addresses of the defective cell sites to provide decompressed addresses.

17. The memory control circuit of claim 15 wherein the data compression circuit is configured to additionally write the decompressed addresses to the fourth memory array.

18. A computer comprising:
a processor;
a read-only memory configured to store instructions for operation of the processor;
a random-access memory array configured to store data;
a spare random-access memory array configured to store data corresponding to defective locations in the random-access memory array;
a control circuit coupled to the processor, the read-only memory, the random-access memory and the spare random-access memory, the control circuit configured to access the read-only memory, the random-access memory and the spare random-access memory to retrieve data in response to commands from the processor; and a compression circuit coupled to the control circuit and configured to compress data indicative of addresses of defective storage locations in the random access memory array to provide compressed addresses and further configured to decompress the compressed addresses.

19. The computer of claim 18 wherein the compression circuit comprises the processor configured to execute instructions stored in the read-only memory.

20. The computer of claim 18 wherein the compression circuit comprises circuitry incorporated within the control circuit.

21. The computer of claim 18 wherein the compression circuit comprises circuitry incorporated within the random-access memory array.

* * * * *